United States Patent
Scheffel et al.

(10) Patent No.: US 12,362,141 B2
(45) Date of Patent: Jul. 15, 2025

(54) APPARATUS AND METHOD FOR DEPOSITING HARD CARBON LAYERS

(71) Applicant: Fraunhofer-Gesellschaft zur Förderung der angewandten Forschung e.V., Munich (DE)

(72) Inventors: Bert Scheffel, Dresden (DE); Matthias Tenbusch, Dresden (DE); Stefan Saager, Dresden (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 24 days.

(21) Appl. No.: 18/185,626

(22) Filed: Mar. 17, 2023

(65) Prior Publication Data

US 2023/0223234 A1 Jul. 13, 2023

Related U.S. Application Data

(63) Continuation of application No. PCT/EP2021/075505, filed on Sep. 16, 2021.

(30) Foreign Application Priority Data

Sep. 17, 2020 (DE) .......................... 102020124269.7

(51) Int. Cl.
*H01J 37/32* (2006.01)
*C23C 14/06* (2006.01)
(Continued)

(52) U.S. Cl.
CPC .... *H01J 37/32055* (2013.01); *C23C 14/0605* (2013.01); *C23C 14/24* (2013.01);
(Continued)

(58) Field of Classification Search
None
See application file for complete search history.

(56) References Cited

U.S. PATENT DOCUMENTS 4,724,058 A * 2/1988 Morrison, Jr. ........ C23C 14/325
  118/723 VE
4,961,958 A 10/1990 Desphandey et al.
(Continued)

FOREIGN PATENT DOCUMENTS

DE 42 21 361 C1 7/1993
DE 44 44 763 A1 6/1998
(Continued)

OTHER PUBLICATIONS

International Search Report and Written Opinion of the International Search Authority mailed Jan. 5, 2022 in International Application No. PCT/EP2021/075505 (English and German languages) (13 pp.)

(Continued)

*Primary Examiner* — Jason Berman
(74) *Attorney, Agent, or Firm* — Crowell & Moring LLP

(57) ABSTRACT

An apparatus and method for depositing a carbon layer includes an arc discharge is formed between an electron source and an evaporation material by means of a first power supply device. The negative terminal of the first power supply device is connected in an electrically conducting manner to the electron source and the positive terminal of the first power supply device is connected in an electrically conducting manner to the evaporation material. A permanent magnet system and a solenoid coil are arranged in a rotationally symmetrical manner around the evaporation material. The evaporation material is formed as a graphite rod which is surrounded by at least one heat-insulating element at least on the rod end to be evaporated of the graphite rod.

14 Claims, 3 Drawing Sheets

(51) Int. Cl.
*C23C 14/24* (2006.01)
*C23C 14/32* (2006.01)
*H01J 37/305* (2006.01)

(52) U.S. Cl.
CPC ........ *C23C 14/325* (2013.01); *H01J 37/3053* (2013.01); *H01J 2237/063* (2013.01); *H01J 2237/3132* (2013.01)

(56) References Cited

U.S. PATENT DOCUMENTS

| | | | |
|---|---|---|---|
| 5,580,429 A | 12/1996 | Chan et al. | |
| 6,103,074 A * | 8/2000 | Khominich | H01J 37/3266 204/298.41 |
| 6,391,164 B1 * | 5/2002 | Beilis | H01J 37/32055 204/298.41 |
| 2003/0234176 A1 | 12/2003 | Haidar | |
| 2004/0168906 A1 * | 9/2004 | Hirakata | B01J 19/088 204/173 |
| 2016/0351379 A1 * | 12/2016 | Sato | H01J 37/32357 |

FOREIGN PATENT DOCUMENTS

| | | |
|---|---|---|
| DE | 10 2010 041 150 A1 | 12/2011 |
| JP | 56-163265 | 12/1981 |
| JP | 4-365855 | 12/1992 |
| JP | 2001-20064 A | 1/2001 |
| KR | 2013000301 A * | 1/2013 |

OTHER PUBLICATIONS

Office Action dated Apr. 19, 2021 for German Patent Application No. 10 2020 124 269.7, note: pages 1 and 2 are English language Explanations to Section C. Result of Determination Document (10 pp.)

Schulz et al., *Applied Physics A*, "Pulsed arc deposition of superhard amorphous carbon films," vol. 78, 2004, pp. 675-679 (5 pp.)

Stüber et al., "Scientific Reports, Magnetron-sputtered super-hard, amorphous carbon layers with graded layer structure," *FZKA* 5919, 1997, 158 pages, (broken into 3 parts for filing this IDS.)

Weissmantel et al., *Surface & Coating Technology*, "Perparation of superhard amorphous carbon films with low internal stress," vol. 188/199, 2004, pp. 268-273, 6 pp.

* cited by examiner

APPARATUS AND METHOD FOR DEPOSITING HARD CARBON LAYERS

RELATED APPLICATIONS

This application is a Continuation of International Patent Application No. PCT/EP2021/075505, filed Sep. 16, 2021, published as WO 2022/058437 A1, which claims priority to German Patent Application 10 2020 124 269.7, filed Sep. 17, 2020. All applications listed in this paragraph are hereby incorporated by reference in their entireties.

BACKGROUND

Carbon layers can be produced with a wide variety of properties, which can be attributed primarily to differently pronounced structures. The layer hardness of carbon layers varies from hard and similar to diamond to soft and similar to graphite. Investigations have demonstrated that the layer properties, in particular the layer hardness, depends on the proportions of $sp^3$ and $sp^2$ bonds and on the hydrogen content. Furthermore, high levels of hardness may be achieved in hydrogen-free layers with a very high proportion of $sp^3$ bonds. Superhard carbon layers with a Young's modulus of 400 GPa to 800 GPa may also be referred to as tetrahedrally bonded amorphous carbon (ta—C). The temperature of the substrates to be coated must be kept relatively low (<300° C.), so that a high proportion of the $sp^3$ bonds are formed and a very high layer hardness can be achieved.

Various methods are known with which such super-hard, tetrahedrally bonded amorphous carbon layers can be produced. In H. Schulz et al., Applied Physics A, Pulsed arc deposition of super-hard amorphous carbon films, Vol. 78, 2004, pp. 675-679, methods are described in which a cathodic vacuum arc, stochastic or guided by a magnetic field, is formed on a graphite cathode with a small base. The carbon of the graphite cathode sublimes and is highly ionized due to the characteristics of the arc discharge. The ionized carbon particles are deposited on a substrate to be coated and, due to their relatively high energy (within a range of about 10-40 eV), form a carbon structure with a very high proportion of $sp^3$ bonds. Due to the very high power density of the arc discharge at the graphite cathode, however, very small spatters called droplets, which are also referred to as macroparticles, occur. These are relatively soft, are embedded in a growing layer, and impair the layer properties of the growing layer. The proportion of droplets in the deposited layers can be significantly reduced with magnetic filters, which deflect the plasma flow emanating from the cathode and collect the droplets on additional walls. However, the coating rate is considerably weakened by such magnetic filtering.

Methods are also described in the aforementioned document, in which pulsed laser bombardment is used to ignite a pulsed, high-current arc discharge. In the case of such laser-induced, pulsed discharges, current intensities of several 100 A to over 1000 A are achieved. Due to the extremely high power density on the graphite surface, however, droplets are also emitted and built into the layer. For this reason, magnetic filters can also be used with these methods, with which the proportion of droplets in the layers can be significantly reduced. However, the technical effort with the various components such as laser, arc discharge, and magnetic filter is very high.

With so-called laser ablation methods, which are known, for example, from Steffen Weissmantel, et al., Surface & Coating Technology, Preparation of superhard amorphous carbon films with low internal stress, Vol. 188/189, 2004, pp. 268-273, a high-power laser pulse is directed at a graphite target in a vacuum, causing pulse-like evaporation of carbon, which is deposited on a substrate. Laser ablation shares many similarities with cathodic arc coating. In both cases, a very high power density is achieved on the graphite target, as a result of which a highly ionized plasma is generated, relatively high-energy particles in the range of about 10-40 eV are generated and droplets also occur during laser ablation.

Harder layers can be produced by means of magnetron sputtering than by merely evaporating carbon, as is known, for example, from M. Stüber, FZ Karlsruhe, Scientific Reports, Magnetron-sputtered super-hard, amorphous carbon layers with graded layer structure, FZKA 5919,1997. This is also due to a higher spa proportion of the bonds and is caused by a certain proportion of high-energy particles in the vapor or plasma flow from the target to the substrate. With magnetron sputtering, the power density at the graphite target is significantly lower than with arc discharge and laser methods. This is presumably the reason why it is not possible to achieve such high levels of hardness in carbon layers with magnetron sputtering as with the arc discharge and laser methods described. However, no or only a few droplets are embedded in the layers.

SUMMARY

The aforementioned methods have the disadvantage that a considerable proportion of droplets are usually built into the layered structure or a considerable amount of technical effort is required in order to reduce the density and size of the droplets. Apparently, there is a connection between the use of very high power densities on the graphite target, the high particle energies that can be achieved therewith, and the very high layer hardness that can be achieved.

The invention relates to an apparatus and a method for coating a substrate with a very hard carbon layer, based on arc evaporation of graphite within a vacuum chamber.

The invention is therefore based on the technical problem of creating a method and an apparatus for depositing carbon layers, by means of which the disadvantages of prior art can be overcome. In particular, it should be made possible with the method according to the invention and the apparatus according to the invention to deposit carbon layers with a very high degree of hardness and to reduce the incorporation of droplets compared to the prior art.

The solution to the technical problem is achieved by the subject matter of the features of the claimed embodiments.

An apparatus according to the invention is based on elements that are known from anodic arc evaporation. A first power supply device feeds an arc discharge between an electron source functioning as a cathode and the evaporation material functioning as an anode. Here, the material of the anode is heated to a large extent by being bombarded with electrons and thereby converted into the vapor phase. An energetic excitation of the vapor takes place through collisions between the electrons of the arc discharge flowing to the anode and the vapor particles. A so-called hot hollow cathode, for example, can be used as the electron source. A hot hollow cathode should be understood to mean a hollow cathode, through which an inert gas such as argon flows, and which is heated to a temperature of at least 1000° C. during operation. A magnet system, which is made up of an arrangement of permanent magnets and a solenoid coil, is arranged in a ring around the evaporation material, which is connected as an anode. The magnetic field of this magnet system serves to guide the electrons onto the anode material and to increase the electron density in the vicinity of the anode, resulting in intensive heating of the anode material and higher ionization of the vapor emitted by the anode.

In an apparatus according to the invention, the carbonaceous material of the anode is in the form of a cylindrical graphite rod. The graphite rod can, for example, be arranged inside a guide tube and pushed by means of a feeding device depending on the evaporation rate inside the guide tube, so that the position of the sublimating end face of the graphite rod does not change significantly during the process.

According to the invention, the evaporation material designed as a graphite rod is completely surrounded at least at the end of the rod to be evaporated by at least one heat-insulating element, which ensures that the heat generated by the arc discharge on the graphite rod is dissipated, for example, only to a small extent via a guide tube.

In one embodiment, the at least one heat-insulating element comprises a porous material with a melting point greater than 2000° C., which lines the inner wall of the guide tube. The porous material is thus in the form of a hollow cylinder, inside which the graphite rod to be vaporized is stored or pushed in by means of the feeding device.

Graphite felt, for example, is particularly suitable as a porous material. In the context of the invention, graphite felt should be understood to mean a woven fabric or a disordered mesh made of carbon fibers. However, porous structures made of other materials, such as sintered aluminum oxide ceramics or metal foam materials made of molybdenum, tantalum, or tungsten, are also possible. The graphite felt essentially fulfilled two functions. Firstly, the graphite felt ensures thermal insulation between the graphite rod and the guide tube, as a result of which the high temperatures that enable the sublimation of carbon can be generated on the end face of the graphite rod to be evaporated. Secondly, the graphite felt serves to electrically contact the graphite rod to be evaporated with the electrical voltage potential of the positive pole of the first power supply device, which is passed on from the guide tube via the graphite felt to the graphite rod.

The guide tube preferably has a stop at the upper end, which prevents the porous material, such as graphite felt, from being pushed out of the top of the guide tube when the graphite rod is fed in. The guide tube can be made of graphite, for example. However, metals and metal compounds or ceramics with a melting point of at least 1000° C. are also suitable as material for the guide tube.

In an alternative embodiment, the evaporation material designed as a graphite rod is completely surrounded at least at the end of the rod to be vaporized by at least two spaced-apart tubular heat reflectors. The heat reflectors are preferably made of a material with a high melting point of over 2000° C. Materials such as graphite, metals or metal compounds containing tantalum, molybdenum, or tungsten or ceramics such as aluminum oxide or boron nitride are listed here as examples. The fact that the at least two tubular heat reflectors are spaced apart from one another interrupts the heat conduction and thus reduces the outflow of heat energy, as a result of which the vaporization of the graphite rod can be maintained stably.

In the method according to the invention for depositing a carbon layer, an arc discharge is formed between an electron source and an evaporation material by means of a first power supply device, the negative pole of the first power supply device being connected to the electron source in an electrically conducting manner and the positive pole of the first power supply device being connected to the evaporation material in an electrically conducting manner. A permanent magnet system and at least one solenoid coil are arranged in a rotationally symmetrical manner around the evaporation material. The method according to the invention is further characterized in that the evaporation material is in the form of a graphite rod and is surrounded by at least one heat-insulating element at least at the end of the graphite rod to be vaporized.

An apparatus according to the invention and the method according to the invention make it possible to deposit carbon layers by means of anodic arc evaporation on a substrate within a vacuum chamber and to maintain the deposition process in a stable manner over a longer period of time. Carbon layers with a very high degree of hardness can be deposited in the process.

BRIEF DESCRIPTION OF THE DRAWINGS

The present invention is explained in more detail below using exemplary embodiments. In the figures.

DETAILED DESCRIPTION

Figure 1:
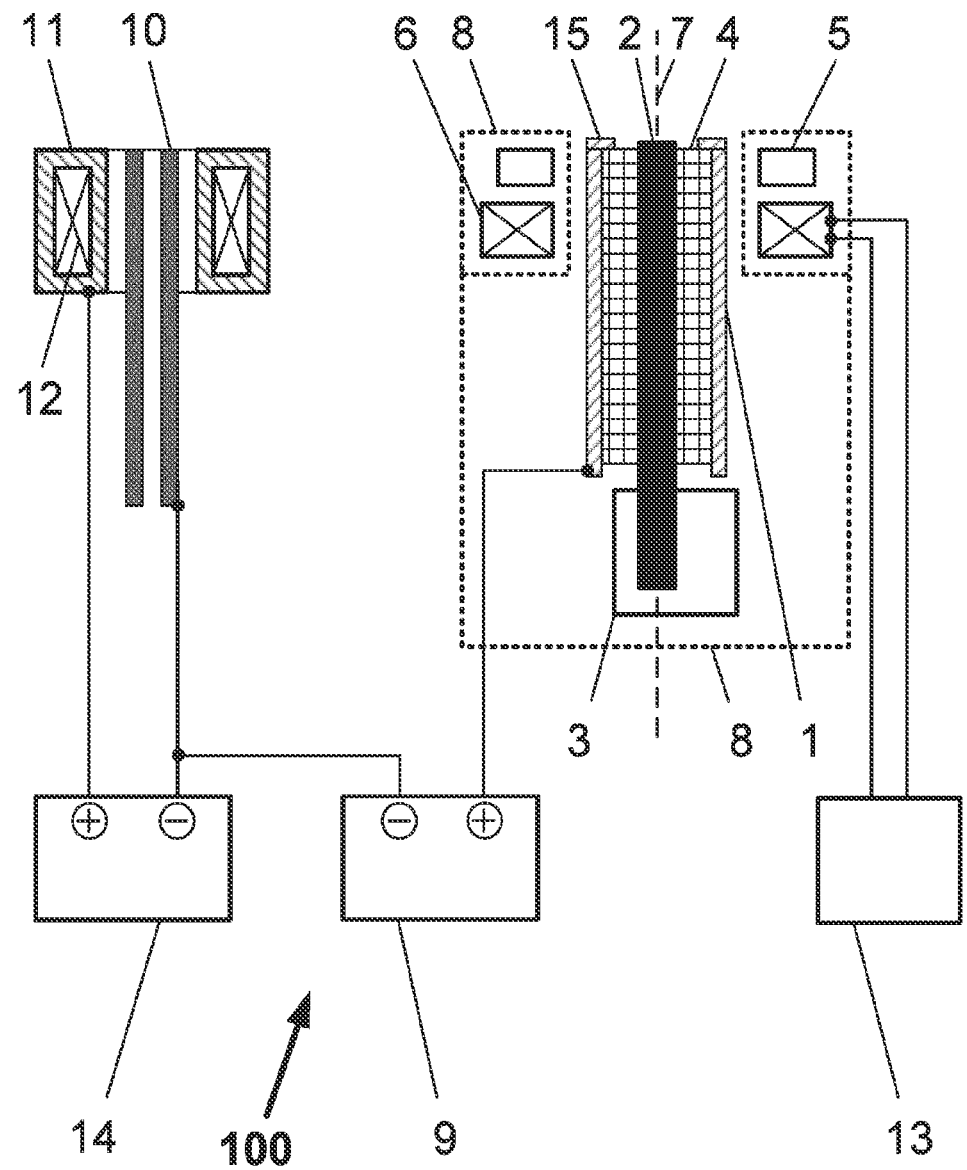
FIG. 1 shows a schematic representation of an apparatus according to the embodiments.

FIG. 1 shows a schematic representation of an apparatus 100 according to the embodiments, with which the method according to the embodiments can also be carried out. The apparatus 100 according to the embodiments comprises a guide tube 1, which is arranged inside a vacuum chamber (which was not shown in FIG. 1) and in which an evaporation material 2 is stored. The evaporation material 2 is in the form of a graphite rod and can be fed in during operation of the apparatus 100 by means of a feeding device 3 inside the guide tube. According to the embodiments, the inner wall of the guide tube 1 is lined with graphite felt 4 as a heat-insulating element, so that the evaporation material 2 designed as a graphite rod is surrounded by the graphite felt 4, at least at the upper end of the graphite rod on which the evaporation material 2 is evaporated. The guide tube 1 is also surrounded by a ring-shaped permanent magnet system 5 and by a ring-shaped solenoid coil 6, which together generate a rotationally symmetrical overall magnetic field around the tube axis 7 of the guide tube 1.

The permanent magnet system 5, the solenoid coil 6, the evaporator crucible 1, and the feeding device 3 are at least partially surrounded by a housing 8, which ensures that these components are not exposed to evaporation material or electrically charged particles during operation of the apparatus 100. In one embodiment, the housing 8 is water-cooled to dissipate the heat generated by the solenoid coil 6.

A first power supply device 9 provides the current for forming an arc discharge between an electron source 10 and the evaporation material 2, the negative pole of the first power supply device 9 being connected to the electron source 10 in an electrically conducting manner and the positive pole of the first power supply device 9 being connected to the guide tube 1 in an electrically conducting manner. Since the graphite felt 4 is electrically conductive and is in mechanical contact with both the guide tube 1 and the evaporation material 2, the evaporation material 2 also has the same electrical voltage potential as the guide tube 1. In this way, an arc discharge is formed between the electron source 10 connected as a cathode and the evaporation material 2 connected as an anode, as a result of which the evaporation material 2 is heated and evaporated by sublimation.

In the exemplary embodiment according to FIG. 1, the electron source 10 is designed as a hot hollow cathode. Alternatively, for an apparatus according to the embodiments, all other electron sources known from prior art, which are used in anodic arc evaporation, are suitable. An anode 11 and a solenoid coil 12 are arranged in a ring around the electron source 10, which is designed as a hollow cathode. A power supply device, which causes a current to flow through the solenoid coil 12, was not shown in FIG. 1 for reasons of clarity.

Also shown in FIG. 1 are a second power supply device 8, which causes an electric current to flow through the solenoid coil 6, and a third power supply device 14, the negative pole of which is connected to the electron source 10 in an electrically conducting manner and the positive pole of which is connected to the anode 11, as a result of which the ignition of a hollow cathode discharge is guaranteed. In addition, as is known from prior art, the hollow cathode is flowed through by a working gas and heated to temperatures of over 1000° C. during operation.

In one embodiment, the second power supply device 13 is designed in such a way that it can be used to periodically change the strength of the electric current flowing through the solenoid coil 6. Because the second power supply device 13 can provide an electric current with a pulsed current intensity in this embodiment, such a power supply device is also referred to as a pulsed power supply device. It has been found that a change in the strength of the electric current flowing through the solenoid coil 6 results in a change in the directional distribution of the vapor propagation of the vaporized evaporation material 2. This change in vapor propagation characteristics is reproducible as a function of coil current. Depending on the combination of the magnetic fields of the permanent magnet system 5 and the solenoid coil 6, the vapor propagation direction can be emitted preferably in the direction of the axis 7 or at an angle inclined to this axis direction. The reason why the propagation characteristics are influenced by the magnetic field is probably due to the fact that the steam flow that forms is highly ionized and the plasma flow is deflected in the magnetic field.

The effect that the directional distribution of the vapor propagation in an apparatus according to the embodiments and with the method according to the embodiments is influenced by the magnitude of the coil current intensity can be utilized. By periodically changing the strength of the electrical current flowing through the solenoid coil 6, the layer thickness distribution on a substrate to be coated can be influenced in a simple manner. If the strength of the current flow through the solenoid coil and thus also the field strength of the overall magnetic field is increased, this has the consequence that the vapor propagation of the evaporated evaporation material 2 is more aligned in the direction of the axis 7, whereas a reduction in the strength of the current flow through the solenoid coil and thus also the field strength of the total magnetic field has the effect that the main vapor propagation direction is formed at an angle to the axis 7, which can be more than 60°.

Figure 2:
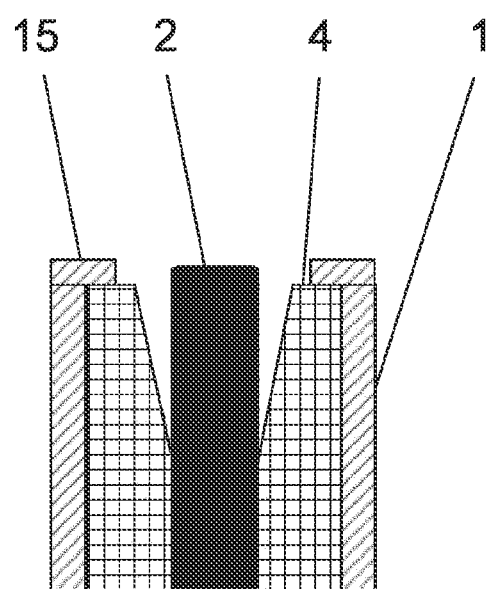
FIG. 2 shows an enlarged schematic representation of the upper end of the guide tube 1 of FIG. 1.

FIG. 2 shows an upper part of the guide tube 1 of FIG. 1 in more detail. It can be seen here that the guide tube 1 has an upper stop 15, which prevents the graphite felt 4 from being pushed out of the guide tube 1 upwards when the evaporation material 2 designed as a graphite rod is fed in.

It is also illustrated in FIG. 2 that the graphite felt 4 in the vicinity of the evaporating end face of the graphite rod partially evaporates during operation of an apparatus according to the embodiments, so that a funnel-shaped gap forms between the non-evaporated graphite felt 4 and the evaporation material 2 designed as a graphite rod. However, this gap has no effect on arc discharge or an effect on carbon evaporation. As mentioned before, the lining of the inner wall of the guide tube 1 with graphite felt 4 according to the embodiments enables stable vaporization of carbon by means of anodic arc vaporization.

A few specific values are given below, merely by way of example, in order to clarify what kind of hard carbon layers can be deposited using an apparatus according to the embodiments and a method according to the embodiments.

In a first test arrangement, a graphite rod with a diameter of 10 mm is vaporized as the evaporation material 2 within a vacuum chamber. The graphite rod is in a guide tube 1 with an inner diameter of 25 mm. The inner wall of the guide tube 1 is lined with graphite felt 4 in such a way that the graphite felt 4 is in full contact with the inner wall of the guide tube 1 as well as with the full circumference of the graphite rod. First, an arc discharge is ignited between the electron source 10, designed as a hollow cathode, and the anode 11 by means of the third power supply device 14, the current strength being 60 A. The working gas argon flows through the hollow cathode. The pressure in the vacuum chamber is adjusted to $1*10^{-3}$ mbar. After the power supply devices for the solenoid coils 6 and 12 are switched on, the first power supply device 9 is also switched on and its current intensity is gradually increased from 0 A to 110 A within 5 minutes. Thereafter, the amperage of the third power supply device 14 is reduced to 10 A and the gas flow through the hollow cathode is also reduced in such a way that the pressure in the vacuum chamber is $7*10^{-4}$ mbar. The feeding device 3 is put into operation, so that the evaporation material 2 designed as a graphite rod is pushed upwards at a speed of 5 cm/h. A first steel substrate is exposed to the carbon vapor for 6 minutes. During this time, a 1 μm thick carbon layer is deposited on the first substrate. Measurements using the nanoindentation method show that the layer has a very high hardness of 55 GPa and a modulus of elasticity of 490 GPa.

In a second test arrangement, a graphite rod with a diameter of 12 mm is vaporized as the evaporation material 2 within a vacuum chamber. The graphite rod is in a guide tube 1 with an inner diameter of 40 mm. The inner wall of the guide tube 1 is lined with graphite felt 4 in such a way that the graphite felt 4 is in full contact with the inner wall of the guide tube 1 as well as with the full circumference of the graphite rod. First, an arc discharge is ignited between the electron source 10, designed as a hollow cathode, and the anode 11 by means of the third power supply device 14, the current strength being 60 A. The working gas argon flows through the hollow cathode. The pressure in the vacuum chamber is adjusted to $1*10^{-3}$ mbar. After the power supply devices for the solenoid coils 6 and 12 are switched on, the first power supply device 9 is also switched on and its current intensity is gradually increased from 0 A to 200 A within 5 minutes. Thereafter, the amperage of the third power supply device 14 is reduced to 10 A and the gas flow through the hollow cathode is also reduced in such a way that the pressure in the vacuum chamber is $7*10^{-4}$ mbar. The feeding device 3 is put into operation, so that the evaporation material 2 designed as a graphite rod is pushed upwards at a speed of 15 cm/h. A second steel substrate is exposed to the carbon vapor for 1.5 minutes. During this time, a 1.2 μm thick layer of carbon is deposited onto the second substrate.

Measurements using the nanoindentation method show that the layer has a very high hardness of 74 GPa and a modulus of elasticity of 680 GPa.

Figure 3:
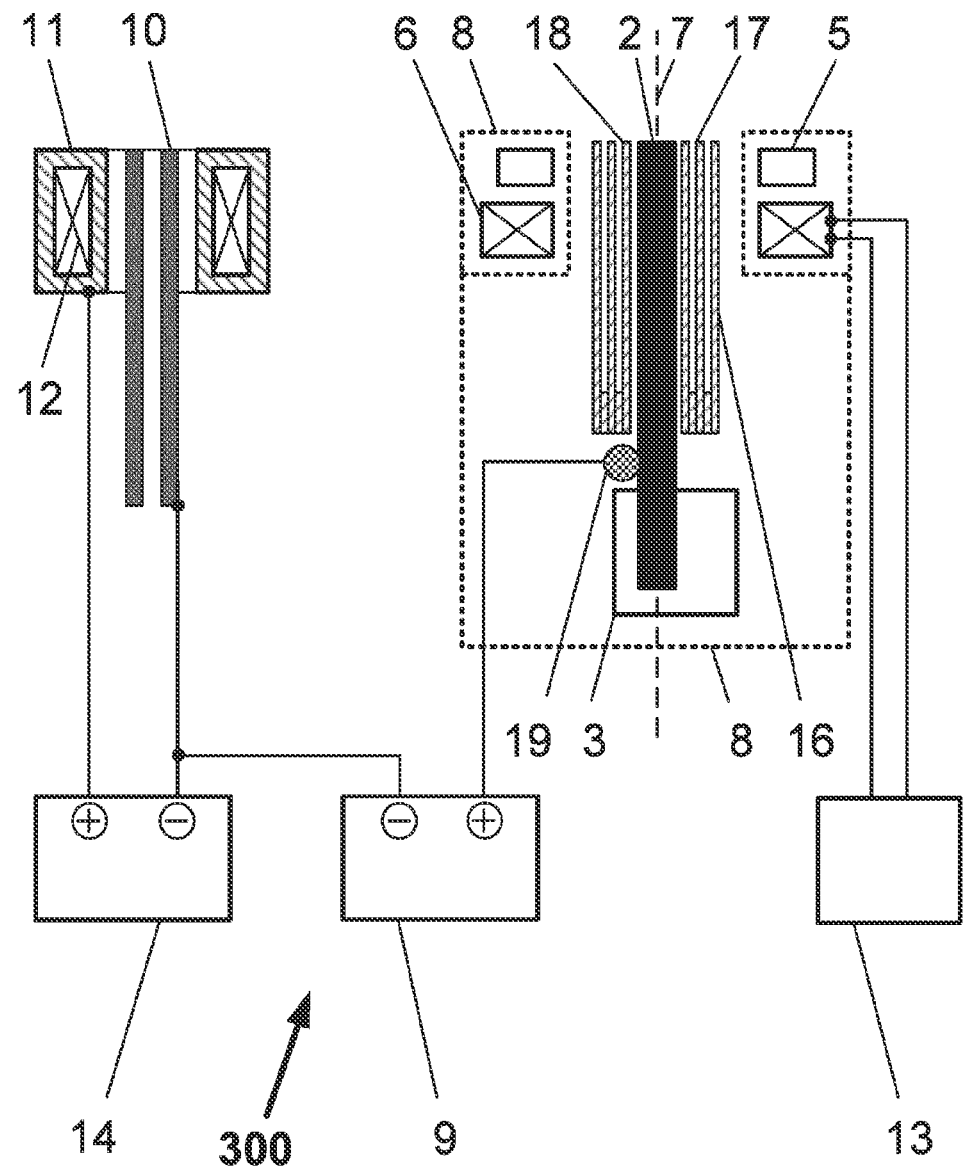
FIG. 3 shows a schematic representation of an alternative apparatus according to the embodiments.

An alternative apparatus 300 according to the embodiments is shown schematically in FIG. 3. The apparatus 300 shown in FIG. 3 has largely the same structure as the device 100 according to the embodiments of FIG. 1. Components from FIG. 3 with identical reference symbols to components from FIG. 1 therefore also have the same structure and the same functionalities.

The apparatus 300 of FIG. 3 differs from the device 100 of FIG. 1 in that the evaporation material 2, which is designed as a graphite rod, is not surrounded by graphite felt but surrounded, at least at the end of the graphite rod to be evaporated, by three spaced-apart tubular heat reflectors 16, 17, and 18, which act as heat-insulating elements. The tubular heat reflectors 16, 17, and 18 ensure that the heat is retained at the end of the graphite rod to be vaporized and the graphite rod can be vaporized in a stable manner.

Another difference is the way in which the electrical contact is made with the evaporation material 2, which is designed as a graphite rod. In the case of the apparatus 300, the graphite rod is contacted by means of a contact element 19 and in this way a connection to the positive pole of the power supply device 9 is established in an electrically conducting manner The contact element can be designed as a sliding contact, for example.

The invention claimed is:

1. An apparatus for depositing a carbon layer on a substrate to be coated, comprising:
    an electron source;
    an evaporation material comprising a graphite rod;
    a first power supply device for forming an arc discharge between the electron source and the evaporation material, wherein a negative pole of the first power supply device is connected with the electron source in an electrically conducting manner and a positive pole of the first power supply device is connected with the evaporation material in an electrically conducting manner;
    a permanent magnet system and at least one solenoid coil, which are arranged rotationally symmetrically around the evaporation material; and
    a heat-insulating element surrounding and in contact with at least an end of the graphite rod to be evaporated.

2. The apparatus according to claim 1, wherein the evaporation material comprising the graphite rod is arranged inside a guide tube and an inner wall of the guide tube is lined, at least at the end of the graphite rod to be evaporated, with a porous material with a melting point greater than 2000° C.

3. The apparatus according to claim 2, wherein the guide tube has an upper stop.

4. The apparatus according to claim 3, wherein the porous material comprises graphite felt.

5. The apparatus according to claim 2, wherein the porous material comprises graphite felt.

6. The apparatus according to claim 1, wherein the evaporation material comprises a graphite rod is surrounded, at least at the end of the graphite rod to be evaporated, by at least two spaced-apart tubular heat reflectors.

7. The apparatus according to claim 1, wherein the electron source comprises a hollow cathode.

8. The apparatus according to claim 1, further comprising:
    a second power supply device connected to the solenoid coil in an electrically conducting manner, the second power supply device being configured as a pulsed power supply device.

9. A method for depositing a carbon layer on a substrate to be coated, the method comprising:
    forming an arc discharge between an electron source and an evaporation material with a first power supply device, wherein a negative pole of the first power supply device is connected with the electron source in an electrically conducting manner and a positive pole of the first power supply device is connected to the evaporation material in an electrically conducting manner; and
    arranging, rotationally symmetrically, a permanent magnet system and a solenoid coil around the evaporation material, wherein the evaporation material comprises a graphite rod, and wherein at least one heat-insulating element surrounds and is in contact with at least an end of the graphite rod to be evaporated.

10. The method according to claim 9, wherein the electron source comprises a hollow cathode.

11. The method according to claim 9, wherein a second power supply device is connected to the solenoid coil in an electrically conducting manner, the second power supply device comprises a pulsed power supply device.

12. The apparatus of claim 1, wherein the substrate to be coated is separate from the electron source and the evaporation source.

13. The method of claim 9, wherein the substrate to be coated is separate from the electron source and the evaporation source.

14. The apparatus of claim 1 comprising a guide tube surrounding and in contact with the heat-insulating element at least at the end of the graphite rod to be evaporated.

* * * * *